US006870374B2

United States Patent
Perkins et al.

(10) Patent No.: US 6,870,374 B2
(45) Date of Patent: Mar. 22, 2005

(54) PROCESS FOR IDENTIFYING ABNORMALITIES IN POWER TRANSFORMERS

(75) Inventors: Mark D. Perkins, St. Charles, MO (US); Asim Fazlagic, St. Louis, MO (US)

(73) Assignee: ABB Technology AG, Zurich (CH)

( * ) Notice: Subject to any disclaimer, the term of this patent is extended or adjusted under 35 U.S.C. 154(b) by 24 days.

(21) Appl. No.: 10/310,103

(22) Filed: Dec. 4, 2002

(65) Prior Publication Data
US 2003/0189431 A1 Oct. 9, 2003

Related U.S. Application Data
(60) Provisional application No. 60/369,671, filed on Apr. 3, 2002.

(51) Int. Cl.[7] .......................... G01R 31/08; G06F 19/00
(52) U.S. Cl. .......................... 324/551; 324/520; 702/58
(58) Field of Search .................. 324/551, 552, 324/554, 659, 667, 681, 683, 520; 702/57–59

(56) References Cited

U.S. PATENT DOCUMENTS

| 4,757,263 A | * 7/1988 | Cummings et al. .......... 324/552 |
| 5,214,595 A | 5/1993 | Ozawa et al. .......... 364/551.01 |
| 5,450,315 A | 9/1995 | Stefanski .................... 364/148 |
| 5,640,154 A | * 6/1997 | Meyer et al. .......... 340/870.18 |
| 5,656,767 A | 8/1997 | Garvey, III et al. ........ 73/61.44 |
| 5,754,055 A | 5/1998 | McAdoo et al. ............. 324/636 |
| 5,869,973 A | 2/1999 | Nosov ......................... 324/678 |
| 5,982,181 A | * 11/1999 | Rokunohe et al. ........... 324/551 |
| 6,064,172 A | 5/2000 | Kuznetsov .................. 318/716 |
| 6,088,658 A | * 7/2000 | Yazici et al. .................. 702/58 |
| 6,192,317 B1 | 2/2001 | Yazici et al. .................. 702/58 |

FOREIGN PATENT DOCUMENTS

EP  0 427 551 A2  5/1991

OTHER PUBLICATIONS

Zheng et al. (Power Engineering Society Summer Meeting, 2002 IEEE, vol.: 1, Jul. 21–25, 2002 pp.:417–421 vol. 1).*
van Bolhuis, J.P.; Gulski, E.; Smit, J.J, (Monitoring and diagnostic of transformer solid insulation; Power Delivery, IEEE Transactions on , vol.: 17, Issue: 2, Apr. 2002 pp.: 528–536).*
Perkins et al. (Dielectric Frequency Response Measurement as a Tool for Trouble Shooting Insulation Power Factor Problems: 2002 International Symposium on Electrical insulation: Apr. 7–10, 2002).*

(List continued on next page.)

Primary Examiner—Anjan K. Deb
(74) Attorney, Agent, or Firm—Woodcock Washburn LLP

(57) ABSTRACT

A preferred method for identifying a type of abnormality in an insulation system of a power transformer comprises measuring dielectric losses in a section of the insulation system, calculating theoretical dielectric losses for the section based on the material properties, geometry, and temperature of the section, and generating a graphical representation of a percent difference between the measured and calculated dielectric losses. The preferred method also comprises comparing a shape of the graphical representation with a shape of one or more graphical representations of a percent difference between measured and theoretical dielectric losses in one or more other sections of insulation each known to have a specific type of abnormality.

26 Claims, 8 Drawing Sheets

OTHER PUBLICATIONS

Gavert et al. (Modelling of Dielectric Measurements on Power Transformers. Cigre Session Paris, Sep. 1998).*

Frimpong et al. (Estimation of Moisture in Cellulose and Oil Quality of Transformer Insulation Using Dielectric Response Measurements: 2001 Conference Doble clients Apr. 1–6, Boston Massachusetts).*

Perkins, Mark, et al., Dielectric Frequency Response Measurement as a Tool For Troubleshotting Insulation Power Factor Problems, 2002 International Symposium on Electrical Insulation (Apr. 7–10. 2002).

Frimpong, George, K., "Estimation of Moisture in Cellulose and Oil quality of Transformer Insulation Using Dielectric Response Measurements," 2001 Conference of Doble Clients [Apr. 1–Apr. 6, 2001, Boston Massachusetts].

U. Gafvert, et al., "Modelling of Dielectric Measurements On Power Transformers," Paper 15–103, CIGRE Session Paris, Sep. 1998.

Boss, P., "Life Assessment of Power Transformers to Prepare a Rehabilitation Based on a Technical–Economical Analysis," CIGRE Session, Paris 2002 [Aug. 25–Aug. 30, 2002].

* cited by examiner

PROCESS FOR IDENTIFYING ABNORMALITIES IN POWER TRANSFORMERS

This application claims priority under 35 U.S.C. §119(e) to U.S. Provisional Patent Application Ser. No. 60/369,671, which was filed on Apr. 3, 2002 and is hereby incorporated by reference in its entirety.

FIELD OF THE INVENTION

The present invention relates to power transformers and, more particularly, to a method for identifying abnormalities in power transformers.

BACKGROUND OF THE INVENTION

Power transformers typically include insulation positioned between or around the various conductive paths therein. The insulation is often formed from a paper or cellulose material. Mineral oil is also commonly used as an insulator in power transformers.

Defects or other abnormalities in the insulation of a power transformer can substantially degrade the performance of the power transformer and, in extreme cases, can cause potentially dangerous malfunctions. For example, moisture and contaminates can degrade the insulating properties of oil, paper, and cellulose insulators. The properties of an insulator can also degrade if the insulator is exposed to voltages greater than its rated voltage. Moreover, defects such as tears, voids, and other flaws, as well as excessive moisture and carbon tracking, can degrade the properties of paper and cellulose insulation. The insulating properties of oil can degrade due to advanced age, overheating, or chemical contamination.

Diagnostic checks are often performed on the insulation of power transformers because of the importance of the insulation to the overall performance of the power transformer. For example, the effectiveness of the insulation in new and newly-refurbished power transformers is usually evaluated before the power transformer is placed in service. Moreover, the insulation of power transformers in the field is often checked on a periodic basis to ensure that the insulation is functioning in a satisfactory manner.

Most commonly-available diagnostic checks for the insulation of power-transformers are adapted to identify the presence of an abnormality, such as a defect, in the insulation system. For example, the so-called "power factor test," defined by the American National Standards Institute (and described in detail below), is a commonly used diagnostic check. (The power factor test is substantially the same as the so-called "tan-δ" test.) Although diagnostic checks such as the power factor test can indicate the presence of an abnormality, these types of checks often cannot provide an indication of the type of abnormality that may be present.

Identifying a specific type of abnormality often necessitates draining and at least partially disassembling the power transformer. For example, excessive resistance in the core-to-ground circuit of power transformers is sometimes misdiagnosed as excessive moisture in the cellulose insulation of the power transformer. In other words, currently-available diagnostic tests can identify the presence of these types of abnormalities, but often cannot differentiate between the abnormalities. Hence, power transformers are sometimes subjected to a time consuming and expensive drying process based on the mistaken belief that excessive moisture is present in the insulation of the power transformer.

Consequently, a need exists for a diagnostic process that can identify the presence of an abnormality, as well as the type of abnormality, in the insulation system of a power transformer.

SUMMARY OF THE INVENTION

A preferred method for identifying a type of abnormality in an insulation system of a power transformer comprises measuring dielectric losses in a section of the insulation system, calculating theoretical dielectric losses for the section based on the material properties, geometry, and temperature of the section, and generating a graphical representation of a percent difference between the measured and calculated dielectric losses. The preferred method also comprises comparing a shape of the graphical representation with a shape of one or more graphical representations of a percent difference between measured and theoretical dielectric losses in one or more other sections of insulation each known to have a specific type of abnormality.

A preferred method comprises measuring a dielectric frequency response of a section of insulation within a power transformer, calculating a theoretical dielectric frequency response for the section, and generating a dielectric frequency response signature for the section. The preferred method also comprises comparing the dielectric frequency response signature to the dielectric frequency response signature of other sections of the insulation known to have particular types of abnormalities.

A preferred method for classifying a type of abnormality in a section of insulation in a power transformer comprises energizing a conductor insulated by the section of insulation with an alternating-current voltage, varying a frequency of the alternating-current voltage between a plurality of discrete frequencies within a predetermined range, and measuring the dielectric loss in the section of insulation at each of the discrete frequencies.

The preferred method further comprises calculating a theoretical dielectric loss for the section of insulation at each of the discrete frequencies, calculating a percent difference between the measured dielectric loss and the theoretical dielectric loss at each of the discrete frequencies, and generating a substantially curvilinear representation of the percent differences between the measured dielectric loss and the calculated dielectric loss at each of the discrete frequencies. The preferred method also comprises comparing a shape of the substantially curvilinear representation to a shape of one or more predetermined curvilinear representations of a percent difference between a measured dielectric loss and a calculated dielectric loss for a section of insulation known to have a particular type of abnormality.

Another preferred method comprises measuring a dielectric loss in a section of an insulation system of a power transformer in response to an alternating-current voltage varied over a predetermined range of frequencies, calculating a theoretical dielectric loss for the section based on the material properties, geometry, and temperature of the section of insulation, and generating a representation of a percent difference between the measured and calculated dielectric losses. The preferred method further comprises determining whether a shape of the representation substantially differs from a representation of a percent difference between measured and calculated dielectric losses in another section of the insulation previously identified as having a specific type of abnormality.

Another preferred method for identifying a type of abnormality in an insulation system of a power transformer comprises measuring dielectric losses in a section of the insulation system, calculating theoretical dielectric losses for the section, and identifying the section as having an abnormality by comparing the measured dielectric losses in the section to the theoretical dielectric losses for the section.

The preferred method also comprises generating a graphical representation of a percent difference between the measured and calculated dielectric losses, and comparing a shape of the graphical representation with a shape of one or more graphical representations of a percent difference between measured and theoretical dielectric losses in one or more other sections of the insulation each known to have a specific type of abnormality.

Another preferred method comprises measuring a dielectric frequency response of a section of insulation within a power transformer, calculating a theoretical dielectric frequency response for the section, and identifying the section as having an abnormality therein by comparing the measured dielectric response and the theoretical dielectric response. The preferred method also comprises generating a dielectric frequency response signature for the section, and comparing the dielectric frequency response signature to a dielectric frequency response signature of other sections of the insulation known to have particular types of abnormalities.

BRIEF DESCRIPTION OF THE DRAWINGS

The foregoing summary, as well as the following detailed description of a preferred embodiment, is better understood when read in conjunction with the appended drawings. For the purpose of illustrating the invention, the drawings show an embodiment that is presently preferred. The invention is not limited, however, to the specific instrumentalities disclosed in the drawings. In the drawings.

DESCRIPTION OF PREFERRED EMBODIMENTS

Figure 1:
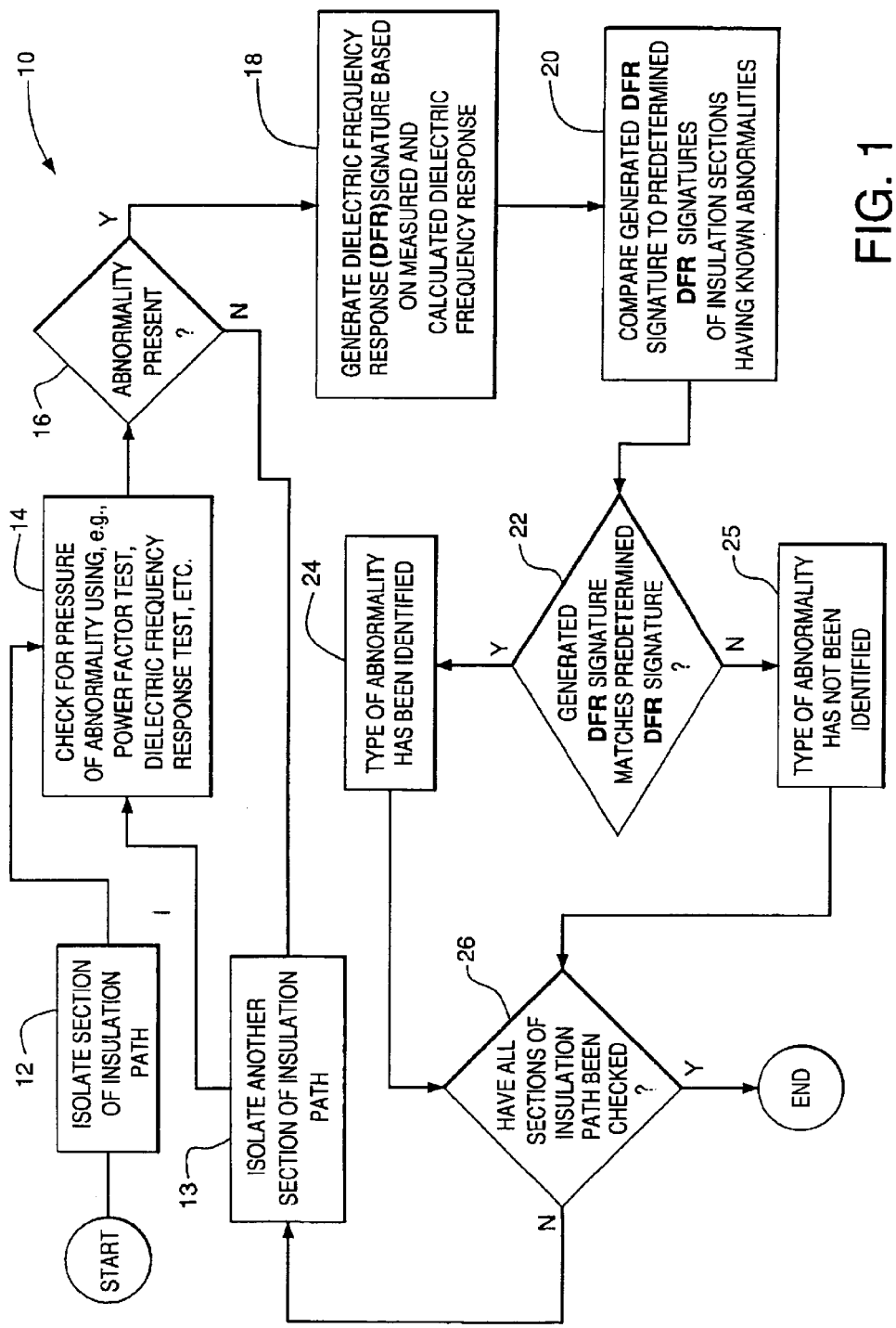
FIG. 1 is a flow diagram of a preferred method for identifying a type of abnormality in the insulation system of a power transformer.
Figure 2:
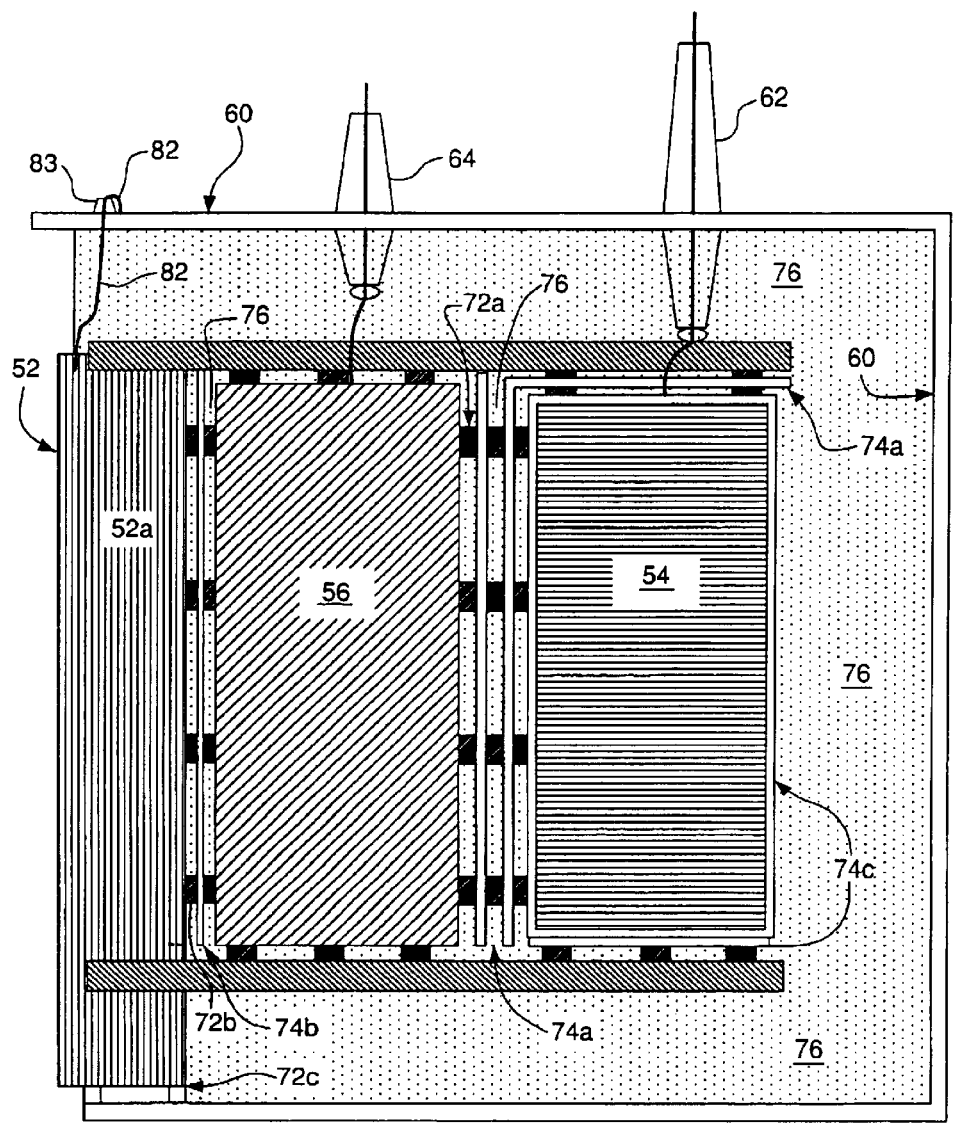
FIG. 2 is a diagrammatic illustration of a power transformer that can be used in conjunction with the method shown in FIG. 1.

A preferred process 10 for identifying an abnormality, e.g., a defect, in an insulation system of an electrical-power transformer is depicted in FIG. 1. The process 10 is described in connection with a conventional power transformer 50 depicted, in part, in FIG. 2. Specific details relating to the power transformer 50 are presented for exemplary purposes only, as the process 10 can be used in conjunction with virtually any type of power transformer.

The power transformer 50 comprises a core 52 having a leg 52a (the core 52 also comprises other legs not visible in FIG. 1). The transformer 50 further comprises a low-voltage winding 56 positioned around the leg 52a, and a high-voltage winding 54 positioned around the low-voltage winding 56. The core 52, high-voltage winding 54, and low-voltage winding 56 are housed in a casing 60. It should be noted that the transformer 50 is depicted diagrammatically in FIG. 1. Various components of the transformer 50 are not shown in FIG. 1, and the scale of some components is altered, for clarity.

The core 52 and the high and low-voltage windings 54, 56 are enclosed in a sealed casing 60. The high-voltage winding 54 is electrically coupled to an alternating-current (ac) voltage source (not shown) by way of high-voltage bushings 62 mounted on the casing 60. The high-voltage bushings 62 each comprise a conductor that conducts electrical current through the casing 60. Each high-voltage bushing 62 also comprises a porcelain ring that substantially insulates the casing 60 from the conductor, and seals the gap between the casing 60 and the conductor.

The low-voltage winding 56 is electrically coupled to a load (not shown) by way of low-voltage bushings 64 mounted on the casing 60. The low-voltage bushings 64 each comprise a conductor that conducts electrical current through the casing 60. Each low-voltage bushing 64 also comprises a porcelain ring that substantially insulates the casing 60 from the conductor, and seals the gap between the casing 60 and the conductor.

The casing 60 is a common ground connection for the transformer 50. The core 52 is grounded to the casing 60 at a single location. More particularly, the core 52 is grounded to the casing 60 by a cable 82 that contacts an outer surface of the casing 60. The cable 82 extends through a core grounding bushing 83 attached to an outer surface of the casing 60. Alternatively, the cable 82 can be fixed directly to an inner surface of the casing 60.

The high-voltage winding 54 is energized by an ac voltage from the voltage source. The ac voltage induces a magnetic flux in the core 52. The magnetic flux is proportional to the number of turns in the high-voltage winding 54. The magnetic flux cuts through the low-voltage winding 56, and induces a voltage in the low-voltage winding 56 that is proportional to the number of turns in the low-voltage winding 56.

The transformer 50 comprises insulation to electrically isolate various metallic components within the transformer 50 from each other. For example, the transformer 50 comprises barriers 74a and spacers 72a positioned between the high and low-voltage windings 54, 56. The barriers 74a and spacers 72a are formed from a solid insulating material such as cellulose pressboard or paper, and insulate the high-voltage winding 54 from the low-voltage winding 56.

The transformer 50 further comprises barriers 74b and spacers 72b positioned between the low-voltage winding 56 and the core leg 52a. The barriers 74b and spacers 72b insulate the low-voltage winding 56 form the core 52. The transformer 50 also comprises spacers 72c that insulate the core 52 from the casing 60. The transformer 50 further comprises barriers 74c that insulate the high and low-voltage windings 56, 54 from the casing 60.

Additional insulating barriers and spacers are also positioned between other grounded components of the transformer 10.

The casing 60 of the transformer 50 is filled with an insulating liquid such as mineral oil 76. The mineral oil 76 functions as both an insulating and cooling medium within the casing 60. Thus, for example, the high and low-voltage windings 54, 56 are insulated by both the mineral oil 76, and the barriers 74a and spacers 72a.

Each of the high and low-voltage windings 54, 56 has its own internal insulation system formed from solid material such as cellulose pressboard or paper, and an insulating liquid such as mineral oil.

Figure 3:
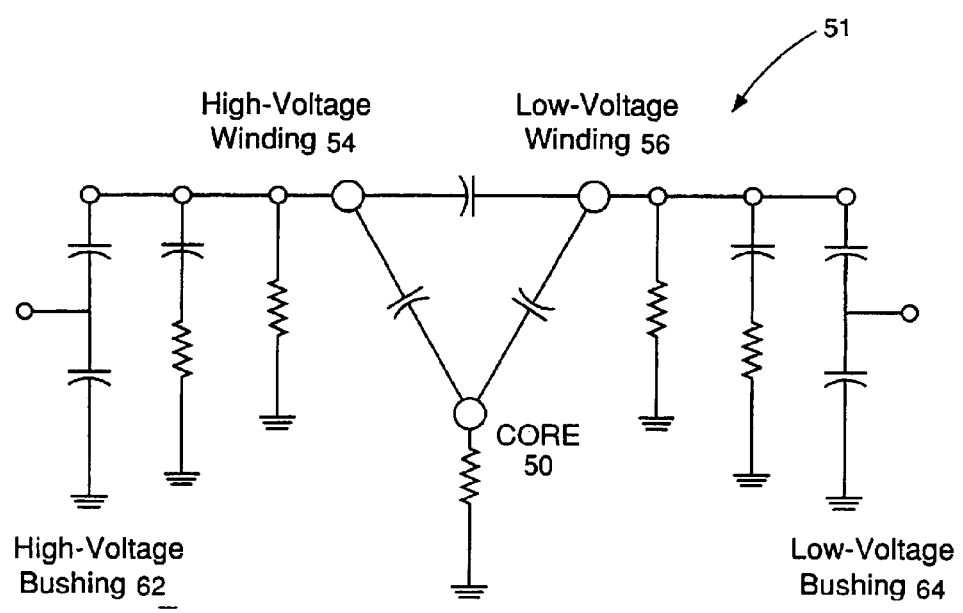
FIG. 3 is a simplified schematic representation of an insulation system of the power transformer shown in FIG. 2.

The above described insulation forms part of an insulation system 51 of the power transformer 50. The insulation system 51 (including both the internal and external insulation structures thereof) is represented in simplified schematic form in FIG. 3.

Specific details relating to the process 10 are as follows. The process 10 can identify the presence of an abnormality, and the approximate location thereof, in the insulation system 51 of the power transformer 50. This is accomplished by isolating discrete sections of the insulation system 51, and running a check on each isolated section under a controlled set of conditions (activities 12, 13, and 14 of FIG. 1). More particularly, the various nodes within the insulation system 51 can be grounded or guarded to isolate node-to-node or node-to-ground sections in the insulation system 51, thereby allowing the dielectric losses in those sections to be measured on an individual basis. For example, it is possible to guard the core 52 or the high or low-voltage bushings 62, 64 in the power transformer 50 to isolate various sections of the insulation system 51. As a specific example, the section of insulation between the high-voltage winding 54 and ground can be isolated by guarding the low-voltage winding 56.

A check of each isolated section of the insulation system 51 can be conducted using conventional techniques commonly known to those skilled in the art of power-transformer insulation-system design. For example, the above-mentioned power factor test, defined by the American National Standards Institute, can be used as a check. A power factor test can be conducted on an isolated section by placing an ac voltage, e.g., 10,000 volts, on the nodes or terminals at each end of the section. In other words, a voltage is applied to opposite ends of the conductor, e.g., the high-voltage winding 54, that is insulated by the isolated section of insulation. The applied voltage typically has a frequency approximately equal to the power frequency of the power transformer 50, e.g., 60 hertz. The resulting capacitive current flowing through the insulation, and the phase angle between the applied voltage and the current, are then measured.

A power factor for the isolated section of insulation, which is indicative of the dielectric loss (or "tan delta") therein, is obtained by calculating the cosine of the phase angle between the voltage and the current. The power factor is compared to a predetermined value to determine whether an abnormality exists in the section. For example, a power factor greater than 0.005, or 0.5 percent, may be interpreted as an abnormality.

Alternatively, a check for abnormalities can be conducted by measuring the dielectric loss for an isolated section of the insulation system 51 while the frequency of the applied voltage is set at various values throughout a predetermined range, e.g., between approximately 0.01 hertz and approximately 1,000 hertz. The resulting graphical representation (typically a curve) of dielectric loss versus frequency for a particular section is hereafter referred to as the "dielectric response" of the section.

Dielectric loss can be quantified based on the applied voltage, the measured current, and the measured phase angle between the applied voltage and the measured current, using conventional techniques known to those skilled in the art of power-transformer insulation-system design. A suitable device for generating the input voltage and measuring the resulting current and phase angle can be obtained from General Electric Company as model no. IDA 200. The dielectric response obtained from the measured voltage, current, and phase angle for a particular section is hereafter referred to as the "measured dielectric response" for that section.

The measured dielectric response is compared to a calculated dielectric response for the corresponding section of the insulation system 51 to determine whether an abnormality exists in that section. The calculated dielectric response is a theoretical representation of the dielectric response of the section, with no abnormalities present therein. The calculated dielectric response is based on the material properties and geometry of the insulation within the section (including the material properties of any oil that functions as insulation within the section). The calculated dielectric response is also based on the temperature of the insulation when the measured dielectric response was acquired.

A theoretical dielectric loss is calculated for each of the frequencies at which the dielectric losses were measured based on the above-noted factors, using conventional techniques commonly known to those skilled in the art of power-transformer insulation-system design. The calculated dielectric response represents a curve of these values, as a function of frequency.

A deviation between the measured dielectric response and the calculated dielectric response greater than a predetermined amount is interpreted as an indication that an abnormality exists in the corresponding section of the insulation system 51, and thus provides an indication of the approximate location of the abnormality.

It should be noted that the above-described checks for determining the presence and approximate location of an abnormality are described for exemplary purposes only; other types of diagnostic tests can be used in lieu of these particular checks.

The type of abnormality is identified after the presence and the approximate location of the abnormality have been identified, i.e., after a section of the insulation system 51 having an abnormality has been identified (activity 16). More particularly, a graphical representation (typically a curve) indicative of the deviation in the measured dielectric response from the calculated dielectric response for the section is developed (activity 18). This graphical representation is hereinafter referred to as the "dielectric frequency response signature," or "DFR signature," of the corresponding section. (Determining the dielectric frequency response of a system is commonly referred to as "frequency domain dielectric spectroscopy.")

The DFR signature is developed by subtracting the calculated dielectric losses at each sampled frequency from the measured dielectric losses at the corresponding frequency. The difference between the calculated and measured dielectric losses at each frequency is divided by the calculated dielectric loss for that frequency, and then multiplied by one hundred. The aggregate curve of these values, plotted as a function of frequency, represents the DFR signature. In other words, the DFR signature is a normalized signature function that is sensitive to changes in the normal dielectric loss frequency spectrum of the insulation system 51.

The DFR signature is subsequently compared to other DFR signatures to determine the type of abnormality present in the test section (activity 20). Applicants have found that particular types of abnormalities often have DFR signatures with unique or distinctive characteristics. A "library," or data base, of DFR signatures that each correspond to a particular type abnormality can be assembled from DFR signatures acquired from power transformers having known abnormalities, or from laboratory tests.

Comparing the DFR signature from a section of the power transformer 50 having an abnormality to the DFR signatures in the data base can facilitate identification of the type of abnormality present in the section. In other words, matching the profile of the DFR signature of the test section with the profile of a reference DFR signature corresponding to a known abnormality can facilitate identification of that abnormality (activities 22, 24). Conversely, the type of abnormality is not identified if a match between the profile of the DFR signature of the test section and the profile of a reference DFR signature is not obtained (activity 25). (It should be noted that the DFR signature varies with the geometric configuration of the corresponding section. Thus, the reference DFR signature must correspond to the geometry of the particular section of insulation being evaluated.)

The above-noted activities can be repeated until all of the sections of insulation system 51 have been checked for abnormalities (activity 26).

The process 10 can be performed as a check on newly-manufactured, newly-repaired, or newly-refurbished power transformers such as the power transformer 10. The process 10 can also be performed as a routine check when the power transformer 10 is in service, i.e., when the power transformer 10 is installed in its operational location in the field. Moreover, the process 10 can be performed after the presence of an abnormality has been identified using a standard power-factor test, or virtually other type of diagnostic tool, to classify the specific type of abnormality.

Other types of diagnostic tests for power transformers such as the power transformer 50, in general, can identify the presence of an abnormality, but not the specific type of abnormality. The process 10 can identify specific types of abnormalities and, notably, can be performed without disassembling the power transformer 50, and without draining the insulating oil of the power transformer 50. The process 10 is particularly advantageous where the power transformer 10 is in service. More particularly, the process 10, by facilitating the identification of specific types of abnormalities, can prevent unnecessary removal and disassembly of the transformer 10 where the abnormality is of the type that can be corrected in place. Hence, the substantial effort, expense, and down time often associated with removing a power transformer from its place of operation, or disassembling the power transformer to diagnose an abnormality therein, can be avoided through the use of the process 10. Furthermore, the process 10 can be performed using readily-available, off-the-shelf equipment, and the time, effort, and skill needed to conduct the process 10 are relatively low.

Moreover, the process 10 can identify abnormalities that conventional diagnostic tests often misdiagnose. For example, one commonly-occurring cause of a high power-factor in transformers such as the transformer 50 is excessive resistance in the core grounding circuit. This particular abnormality may be caused by higher-than-normal resistance between the core and the core grounding strap, or by higher-than normal resistance between the individual laminations in the core. Conventional diagnostic tests such as the power factor test often cannot distinguish between excessive resistance in the core grounding circuit, and moisture in the cellulose insulation of the power transformer. Hence, power transformers exhibiting a high power factor due to excessive resistance in the core grounding circuit sometimes undergo unnecessary drying procedures on a mistaken belief that moisture is present in the cellulose insulation thereof.

Figure 4:
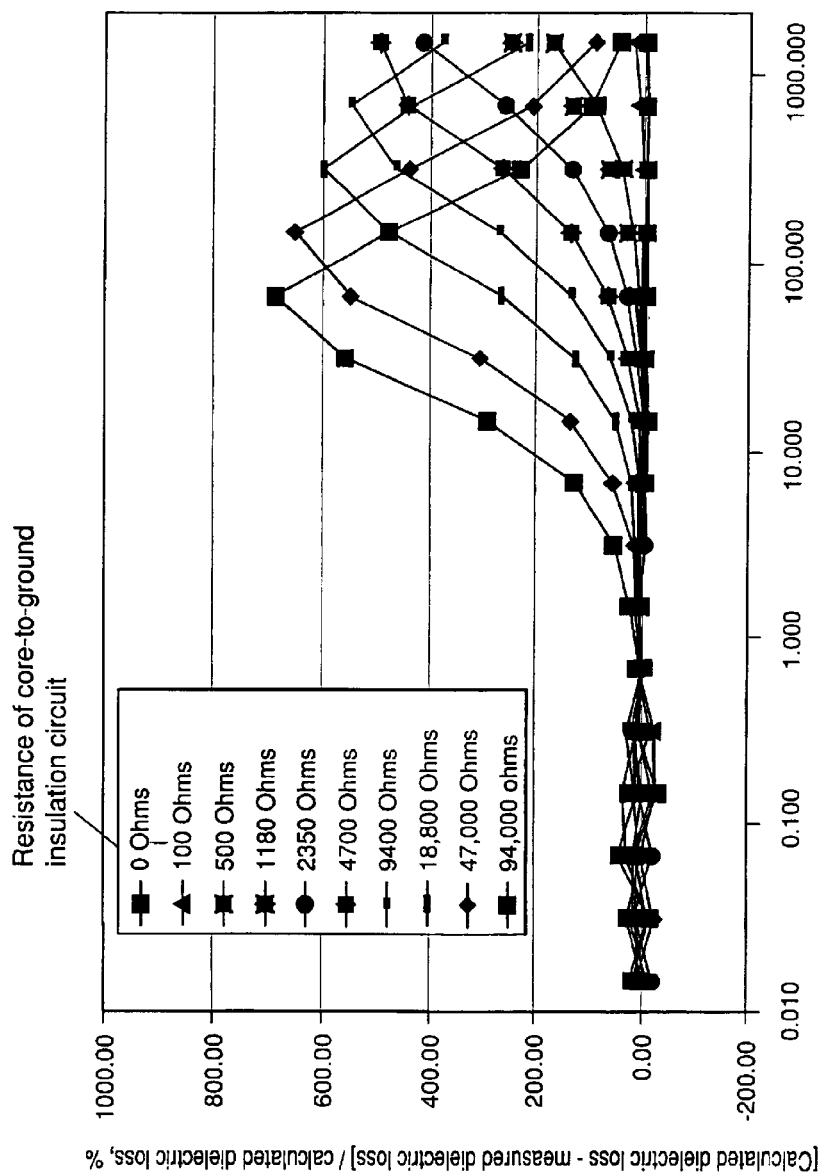
FIG. 4 depicts a series of dielectric frequency response signatures for a section of insulation from a power transformer, wherein the dielectric frequency response signatures correspond to different values of resistance in the core-to-ground circuit of the transformer.

The process 10, by contrast, can specifically identify higher-than-normal resistance in the core-to-ground circuit of transformers such as the transformer 10. For example, FIG. 4 depicts a series of experimentally-determined DFR signatures for the core-to-ground insulation circuit of a two-winding power transformer similar to the power transformer 50. The resistance of the core-to-ground circuit was varied throughout a range of values by connecting resistors of different resistances to the grounding strap of the power transformer. The DFR signature for the corresponding section of insulation was measured while the resistance of the core-to-ground circuit was set at each of the values indicated on FIG. 4.

FIG. 4 shows that the DFR signatures at the different values of core-to-ground resistance are substantially the same at the lower-frequency input voltages. The profiles of the DFR signatures vary substantially, however, at the higher-frequency input voltages. More particularly, the DFR signature corresponding to each different value of resistance has a distinct profile at the higher-frequency input voltages. The distinctiveness of the DFR signatures corresponding to each value of resistance can be used to identify a higher-than-normal resistance in the core-to-ground circuit of the transformer, with minimal potential for the high-than-normal resistance to be misdiagnosed as an insulation-related abnormality.

Moreover, the power factor test is performed at one frequency of input voltage, and may therefore fail to diagnose abnormalities that manifest themselves at frequencies other than the tested frequency. The DFR signature, by contrast, is acquired over a range of input-voltage frequencies, and can thus identify abnormalities that manifest themselves at frequencies other than the single test frequency of the power factor test.

Figure 5:
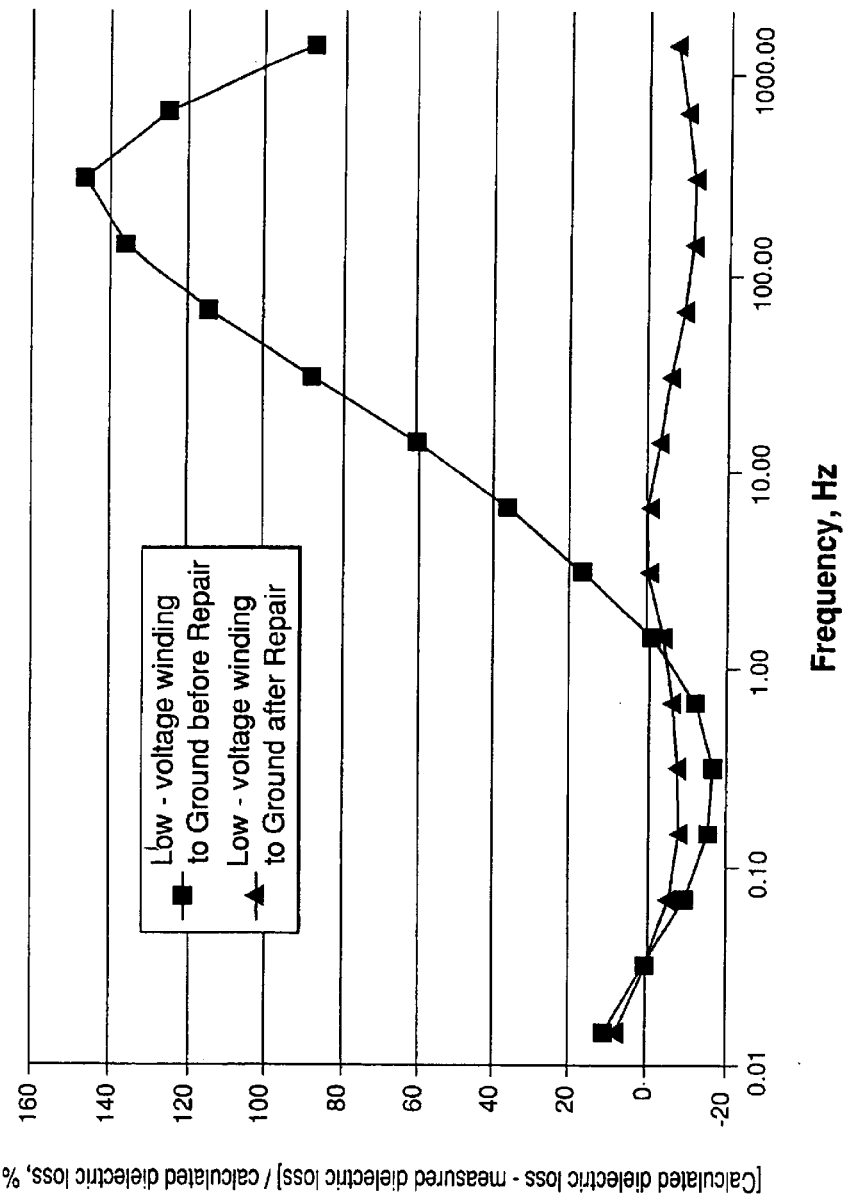
FIG. 5 depicts a dielectric frequency response signature for a section of insulation before and after correction of an abnormality affecting the section of insulation.

FIG. 5 depicts actual DFR signatures acquired before and after an abnormality was diagnosed and corrected in a primary transformer similar to the power transformer 50. The presence of the abnormality was originally detected based on a high (greater than 0.5 percent) power-factor reading. The abnormality was subsequently identified as higher-than normal resistance in the core-to-ground circuit of the primary transformer based on a comparison between the measured DFR signature and a reference DFR signature corresponding to high core-to-ground resistance, upon inspection of the primary transformer, was traced to an auxiliary transformer used in a load tap changer electrically coupled to the primary transformer.

FIG. 5 depicts the DFR signatures for the affected section of insulation measured before and after the auxiliary transformer was modified to reduce the high core-to-ground resistance in the primary transformer. FIG. 5 demonstrates that the DFR signature before correction of this abnormality has a distinctive profile in relation to the DFR signature after the repair (the profile of the DFR signature after the repair is typical of an insulation section of that particular geometry without any abnormalities).

Figure 6:
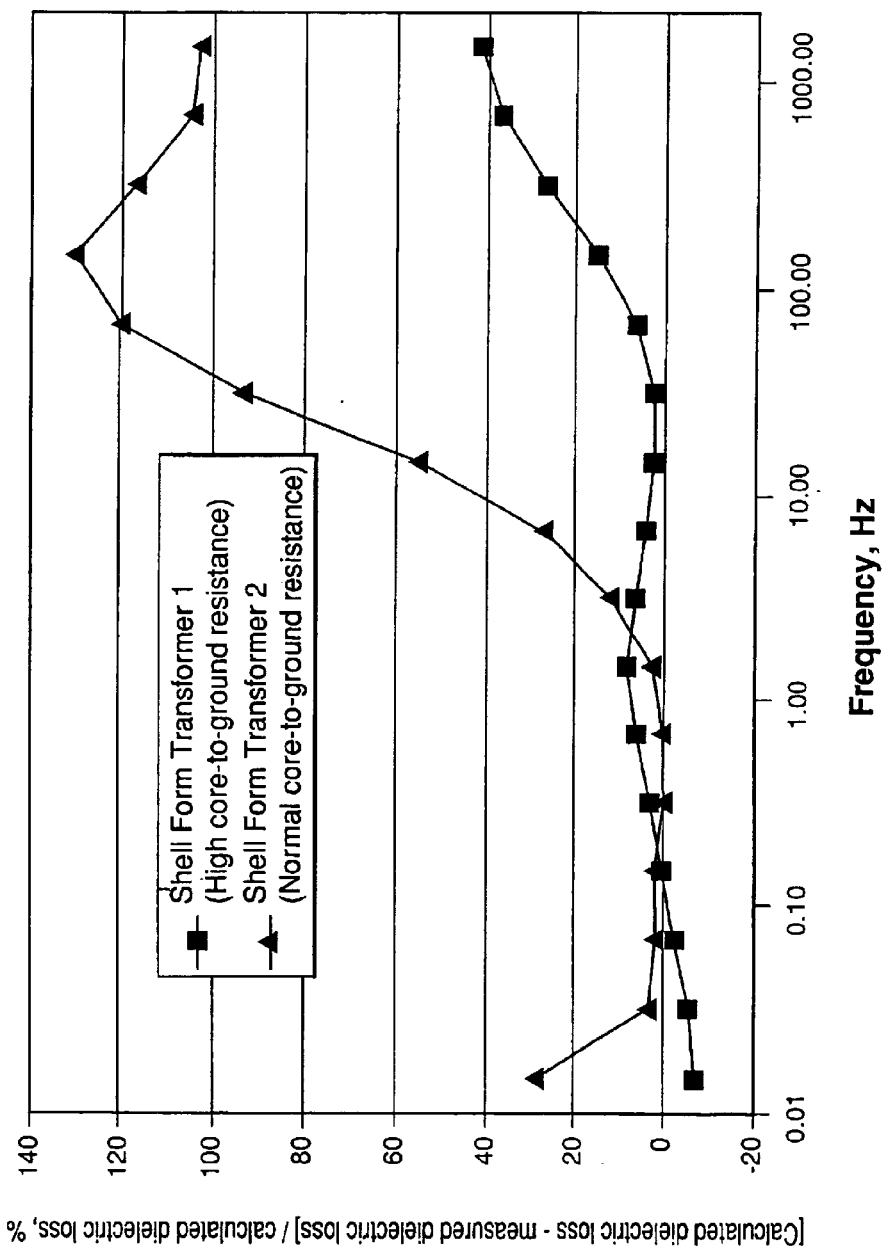
FIG. 6 depicts a first dielectric frequency response signature of a section of insulation from a first transformer having higher-than-normal core-to-ground resistance, and a second dielectric frequency response signature of a section of insulation from a second transformer having normal core-to-ground resistance.

FIG. 6 depicts a first dielectric frequency response signature of a section of insulation from a first transformer having higher-than-normal core-to-ground resistance. FIG. 6 also depicts a second dielectric frequency response signature of a section of insulation from a second transformer having normal core-to-ground resistance. As is evident from FIG. 6, this particular type of condition can be identified by the distinctive profile of the dielectric frequency response signature of the affected section.

Figure 7:
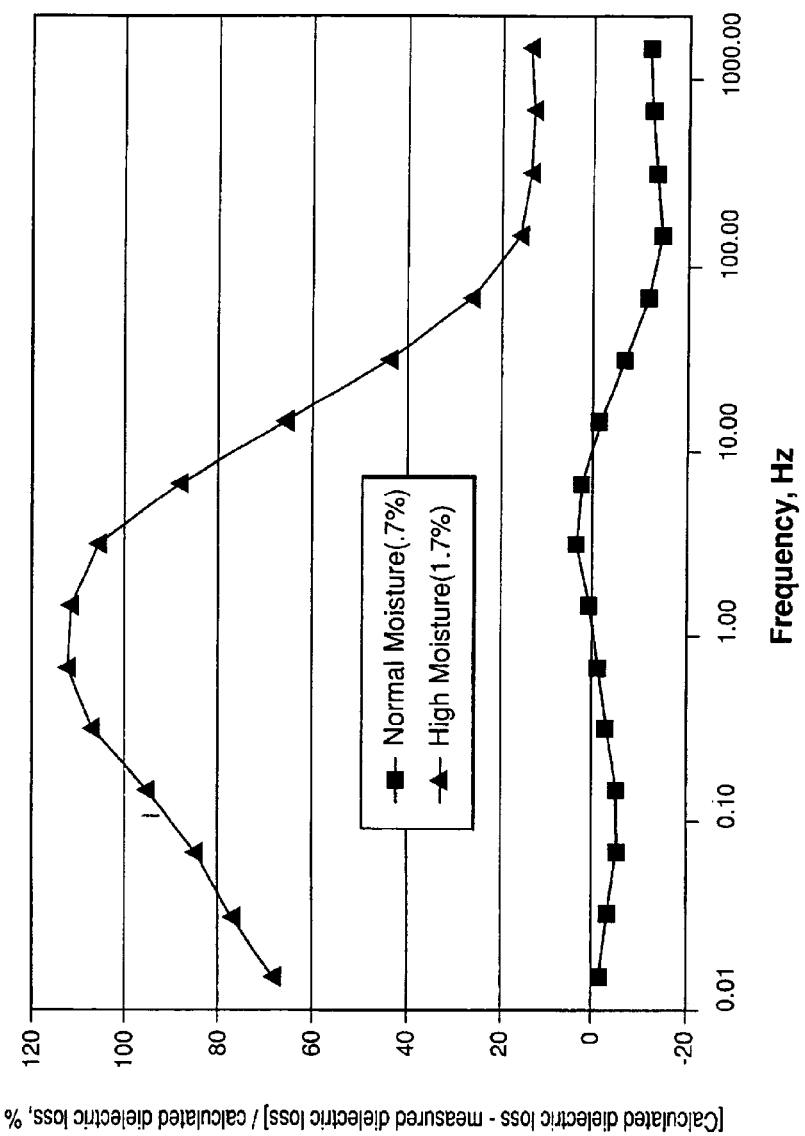
FIG. 7 depicts a dielectric frequency response signature for a section of insulation having a higher-than-normal level of moisture therein.
Figure 8:
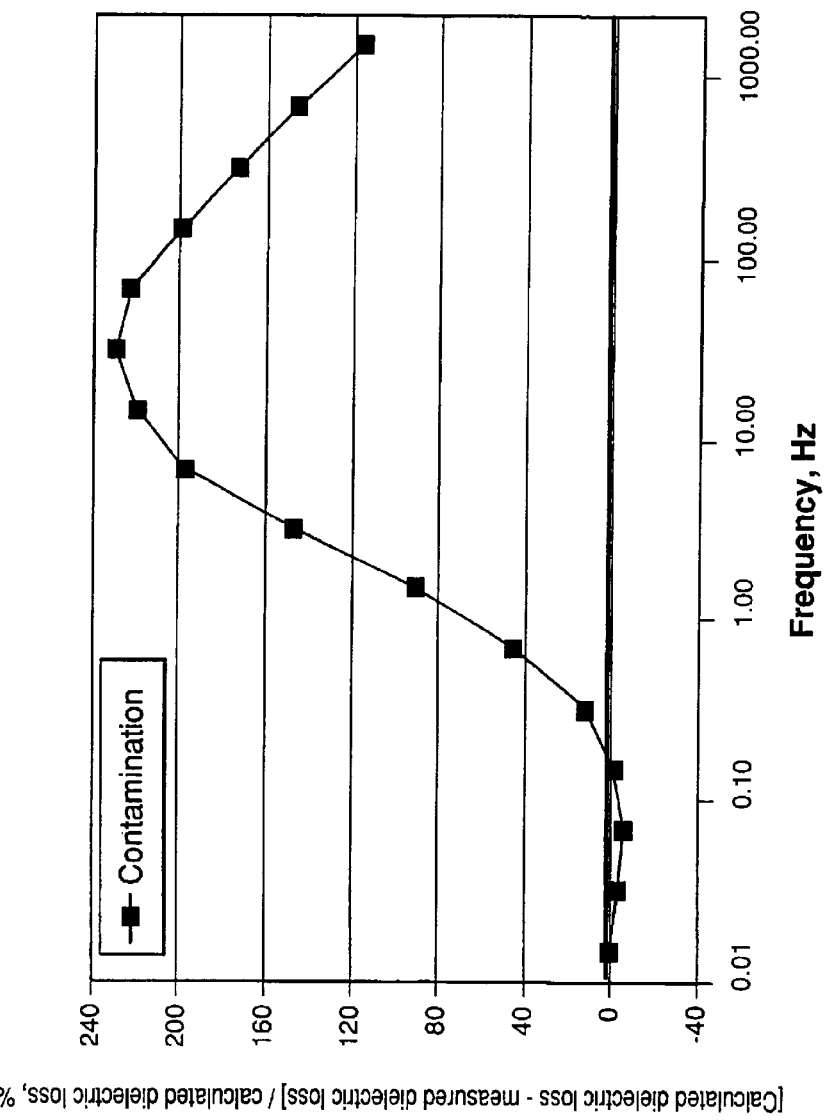
FIG. 8 depicts a dielectric frequency response signature for a section of insulation exhibiting chemical contamination.

FIG. 7 depicts a DFR signature acquired from a section of insulation having a relatively high level of moisture therein, and a second DFR signature acquired from a section of insulation having a relatively low level of moisture therein. FIG. 8 depicts a DFR signature acquired from a section of insulation exhibiting chemical contamination. The unique profiles of these DFR signatures each correspond substantially to a particular type of insulation abnormality, and can therefore be used to identify such abnormalities in other sections of insulation.

It is to be understood that even though numerous characteristics and advantages of the present invention have been set forth in the foregoing description, the disclosure is illustrative only and changes can be made in detail within the principles of the invention to the full extent indicated by the broad general meaning of the terms in which the appended claims are expressed.

What is claimed is:

1. A method for identifying a type of abnormality in an insulation system of a power transformer, comprising:
    measuring dielectric losses in a section of the insulation system;
    calculating theoretical dielectric losses for the section based on the material properties, geometry, and temperature of the section;
    generating a graphical representation of a percent difference between the measured and calculated dielectric losses; and
    comparing a shape of the graphical representation with a shape of one or more graphical representations of a percent difference between measured and theoretical dielectric losses in one or more other sections of insulation each known to have a specific type of abnormality.

2. The method of claim 1, wherein measuring a dielectric loss in the section comprises performing a dielectric frequency response test on the section.

3. The method of claim 2, wherein performing a dielectric frequency response test on the section comprises performing a plurality of power-factor tests on the section, each of the power factor tests being conducted using an input-voltage frequency different from an input-voltage frequency used for the other ones of the power factor tests.

4. The method of claim 1, wherein generating a graphical representation of a percent difference between the measured and theoretical dielectric losses comprises generating a dielectric frequency response signature for the section.

5. The method of claim 4, wherein generating a dielectric frequency response signature for the section comprises calculating a difference between each of the theoretical dielectric losses and a corresponding one of the measured dielectric losses, and calculating a quotient of the difference and a corresponding one of the theoretical dielectric losses by dividing the difference by the corresponding one of the theoretical dielectric losses.

6. The method of claim 5, wherein generating a dielectric frequency response signature for the section further comprises multiplying the quotient by one hundred.

7. The method of claim 1, further comprising reading the one or more graphical representations of a percent difference between measured and theoretical dielectric losses in one or more other sections of insulation each known to have a specific type of abnormality from a data base.

8. The method of claim 1, further comprising matching the shape of the graphical representation of a percent difference between the measured and calculated dielectric losses with a shape of one of the one or more graphical representations of a percent difference between measured and theoretical dielectric losses in one or more other sections of insulation each known to have a specific type of abnormality.

9. The method of claim 1, further comprising identifying the section as having an abnormality by comparing the measured dielectric losses in the section to the theoretical dielectric losses for the section.

10. The method of claim 1, further comprising electrically isolating the section before measuring the dielectric losses in the section.

11. The method of claim 1, wherein comparing a shape of the graphical representation with a shape of one or more graphical representations of a percent difference between measured and theoretical dielectric losses in one or more other sections of insulation each known to have a specific type of abnormality comprises determining whether the shape of the graphical representation substantially differs from the shape of the one or more graphical representations of a percent difference between measured and theoretical dielectric losses in one or more other sections of insulation each known to have a specific type of abnormality.

12. The method of claim 1, wherein calculating theoretical dielectric losses for the section based on the material properties, geometry, and temperature of the section comprises calculating the theoretical dielectric losses without accounting for effects of any abnormalities in the section.

13. A method, comprising:
    measuring a dielectric frequency response of a section of insulation within a power transformer;
    calculating a theoretical dielectric frequency response for the section;
    generating a dielectric frequency response signature for the section; and
    comparing the dielectric frequency response signature to the dielectric frequency response signature of other sections of the insulation known to have particular types of abnormalities.

14. The method of claim 13, further comprising identifying the presence of an abnormality in the section by comparing the measured dielectric frequency response to the theoretical dielectric frequency response.

15. The method of claim 13, further comprising identifying the presence of an abnormality in the section by performing a power factor test on the section.

16. A method for classifying a type of abnormality in a section of insulation in a power transformer, comprising:
    energizing a conductor insulated by the section of insulation with an alternating-current voltage;
    varying a frequency of the alternating-current voltage between a plurality of discrete frequencies within a predetermined range;
    measuring the dielectric loss in the section of insulation at each of the discrete frequencies;
    calculating a theoretical dielectric loss for the section of insulation at each of the discrete frequencies;
    calculating a percent difference between the measured dielectric loss and the theoretical dielectric loss at each of the discrete frequencies;

generating a substantially curvilinear representation of the percent differences between the measured dielectric loss and the calculated dielectric loss at each of the discrete frequencies; and comparing a shape of the substantially curvilinear representation to a shape of one or more predetermined curvilinear representations of a percent difference between a measured dielectric loss and a calculated dielectric loss for a section of insulation known to have a particular type of abnormality.

17. The method of claim 16, further comprising electrically isolating the conductor from other conductors in the power transformer before energizing the conductor.

18. The method of claim 16, further comprising identifying the section of insulation as having an abnormality by comparing at least one of the measured dielectric losses to a corresponding one of theoretical dielectric losses.

19. The method of claim 16, wherein varying a frequency of the alternating-current voltage between a plurality of discrete frequencies within a predetermined range comprises varying the frequency of the alternating-current voltage between approximately 0.01 hertz and approximately 1,000 hertz.

20. The method of claim 16, further comprising reading the one or more predetermined curvilinear representations of a percent difference between a measured dielectric loss and a calculated dielectric loss for a section of insulation known to have a particular type of abnormality from a data base.

21. The method of claim 16, further comprising matching the substantially curvilinear representation of the percent differences between the measured dielectric loss and the calculated dielectric loss at each of the discrete frequencies to one of the one or more predetermined curvilinear representations of a percent difference between a measured dielectric loss and a calculated dielectric loss for a section of insulation known to have a particular type of abnormality.

22. The method of claim 16, wherein calculating a theoretical dielectric loss at each of the discrete frequencies comprises calculating the theoretical dielectric loss at each of the discrete frequencies with accounting for any abnormalities in the section of insulation.

23. A method, comprising:

measuring a dielectric loss in a section of an insulation system of a power transformer in response to an alternating-current voltage varied over a predetermined range of frequencies;

calculating a theoretical dielectric loss for the section based on the material properties, geometry, and temperature of the section of insulation;

generating a representation of a percent difference between the measured and calculated dielectric losses; and determining whether a shape of the representation substantially differs from a representation of a percent difference between measured and calculated dielectric losses in another section of the insulation previously identified as having a specific type of abnormality.

24. A method for identifying a type of abnormality in an insulation system of a power transformer, comprising:

measuring dielectric losses in a section of the insulation system;

calculating theoretical dielectric losses for the section;

identifying the section as having an abnormality by comparing the measured dielectric losses in the section to the theoretical dielectric losses for the section;

generating a graphical representation of a percent difference between the measured and calculated dielectric losses; and comparing a shape of the graphical representation with a shape of one or more graphical representations of a percent difference between measured and theoretical dielectric losses in one or more other sections of the insulation each known to have a specific type of abnormality.

25. The method of claim 24, further comprising electrically isolating the section of the insulation system before measuring the dielectric losses in the section of the insulation system.

26. A method, comprising:

measuring a dielectric frequency response of a section of insulation within a power transformer;

calculating a theoretical dielectric frequency response for the section;

identifying the section as having an abnormality therein by comparing the measured dielectric response and the theoretical dielectric response;

generating a dielectric frequency response signature for the section; and comparing the dielectric frequency response signature to a dielectric frequency response signature of other sections of the insulation known to have particular types of abnormalities.

* * * * *